(12) United States Patent
Cupo et al.

(10) Patent No.: US 6,765,929 B1
(45) Date of Patent: Jul. 20, 2004

(54) METHOD AND APPARATUS FOR COMBINING SIGNALS

(75) Inventors: Robert Louis Cupo, Eatontown, NJ (US); E Anthony Hinds, Old Bridge, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/245,295

(22) Filed: Feb. 5, 1999

(51) Int. Cl.[7] .............................. H04B 1/04; H04J 4/00
(52) U.S. Cl. ...................................... 370/478; 455/103
(58) Field of Search ................................ 348/707, 723, 348/724; 370/468, 478; 455/103, 104

(56) References Cited

U.S. PATENT DOCUMENTS

| | | | | |
|---|---|---|---|---|
| 5,289,272 A | * | 2/1994 | Rabowsky et al. | 348/8 |
| 5,499,271 A | * | 3/1996 | Plenge et al. | 375/295 |
| 5,774,193 A | * | 6/1998 | Vaughan | 348/723 |
| 6,278,498 B1 | * | 8/2001 | Neff | 348/723 |
| 6,377,314 B1 | * | 4/2002 | Collins et al. | 348/723 |
| 6,433,835 B1 | * | 8/2002 | Hartson et al. | 348/608 |

* cited by examiner

Primary Examiner—Alpus H. Hsu
Assistant Examiner—Toan D. Nguyen

(57) ABSTRACT

An FM transmitter forms a Digital Audio Broadcasting (DAB) signal comprising a digital FM signal and an analog FM signal. The FM transmitter comprises an RF nonlinear amplifier coupled to a first antenna and an RF linear amplifier coupled to a second antenna. The RF non-linear amplifier and antenna transmit the analog FM signal. The RF linear amplifier and antenna transmit the digital FM signal. The FM transmitter controls the signal transmissions such that the transmitted analog FM signal and the transmitted digital FM signal are combined, or multiplexed, together in the channel itself (here, the atmosphere) to form the DAB signal.

10 Claims, 2 Drawing Sheets

300

US 6,765,929 B1

METHOD AND APPARATUS FOR COMBINING SIGNALS

FIELD OF THE INVENTION

This invention relates generally to communications, more particularly, to the multiplexing of signals for transmission.

BACKGROUND OF THE INVENTION

In systems where multiple signals are desired to be transmitted simultaneously within a given frequency band, some form of signal combination is required. When the signaling formats of the multiple signals are similar, simple frequency division multiplexing is a convenient solution. However, any proposed solution becomes more complicated when different signal formats are used. Some signaling formats that require different handling are: spread spectrum, single-tone QAM, multi-tone QAM, and analog modulation schemes.

In particular, consider the proposed In Band On Channel (IBOC) scheme for Digital Audio Broadcasting (DAB). In switching to the DAB system, it is envisioned that there will be a period of time (a transition period) during which both analog FM signals and digital FM signals co-exist. This spectral allocation is illustrated in FIG. 1. In FIG. 1, the triangular spectrum is produced by standard FM modulation as is currently used in the commercial FM band (88–108 Mhz), wherein stands for carrier frequency. The two rectangular sidebands are envisioned to be digitally modulated multi-tone versions of Quadrature Phase Shift Keying (QPSK). Thus, this DAB transition period requires the frequency division multiplexing of analog and digitally modulated signals. (The analog and digital bands simulcast the program material so that this IBOC approach will be compatible with current analog FM receivers.)

Currently, there are two schools of thought on how to mix multiple signals in a single transmission. These methods can be described as pre-amplification and post amplification mixing.

The pre-amplification mixing method is illustrated by FIG. 2. As shown in FIG. 2, combiner 20 provides a combined signal 3, which is the combination of the analog (1) and digitally (2) modulated signals. Combined signal 3 is applied to RF amplifier 25, which drives antenna 30. Although is it relatively simple to combine these signals (via combiner 20), there remains the problem of designing RF amplifier 25 to simultaneously process the two signals. In general, the amplifiers currently used in FM transmissions are of the class C variety. More specifically, these amplifiers are not linear. While this is not a problem for the analog portion of the combined FM signal, this means that current FM amplifiers cannot effectively pass a QAM (or digitally modulated) type signal with any true fidelity. Further, current FM amplifiers have an effective bandwidth of 200 kHz ($f_c \pm 100$ kHz). As such, to use the architecture of FIG. 2 in a DAB system requires existing FM stations buy a new type of high power linear RF amplifier (with a bandwidth of 400 kHz ($f_c \pm 200$ kHz)) so that both digital and analog modulated signals can be effectively combined. In addition, any such new RF amplifier design would become obsolete once a transition to an all digital version of IBOC is desired.

The second method, post amplification, requires two amplifiers (40 and 45) and a combining network (50) rated for high power as illustrated in FIG. 3. Unfortunately, such a combining network is typically expensive and inefficient—significant power is lost between RF amplifiers 40 and 45 and antenna 30. Thus, there is no way for the radio station to continue to broadcast the analog FM signal with the power it uses today. Radio Stations will either have to replace the amplifier with one of higher power or suffer the loss of analog FM coverage.

As a result, during this transition period both of the above-described solutions are undesirable because of the expense or loss of coverage area incurred.

SUMMARY OF THE INVENTION

We have discovered another alternative for multiplexing disparate signals that is more cost effective than the above-mentioned approaches. In particular, and in accordance with the principles of the invention, a multiplexed signal is formed by separately transmitting each signal in such a way that the multiplexing of the signals occurs in the channel. This eliminates the need for a combiner and cost is reduced.

In an embodiment of the invention, an FM transmitter comprises an RF nonlinear amplifier coupled to a first antenna and an RF linear amplifier coupled to a second antenna. The RF non-linear amplifier and antenna transmit an analog FM signal. The RF linear amplifier and antenna transmit a digital FM signal. The FM transmitter controls the signal transmissions such that the transmitted analog FM signal and the transmitted digital FM signal are combined, or multiplexed, together in the channel itself (here, the atmosphere) to form the transition DAB signal.

As a result there is virtually no attenuation of either signal between the RF amplifier and the antenna. Further, this approach provides a low cost alternative to the earlier described approaches. The linear amplifier is not required to be very high power since it must fit within the FCC mask (which is some 20 dB below the analog signal) in the sideband. Also, there is no change to their current analog FM signal processing. It should also be noted that when the time comes to transition to an all digital approach, the FM transmitting station can simply substitute another high power linear amplifier for the class C amplifier used for the analog FM.

DETAILED DESCRIPTION

Figure 1:
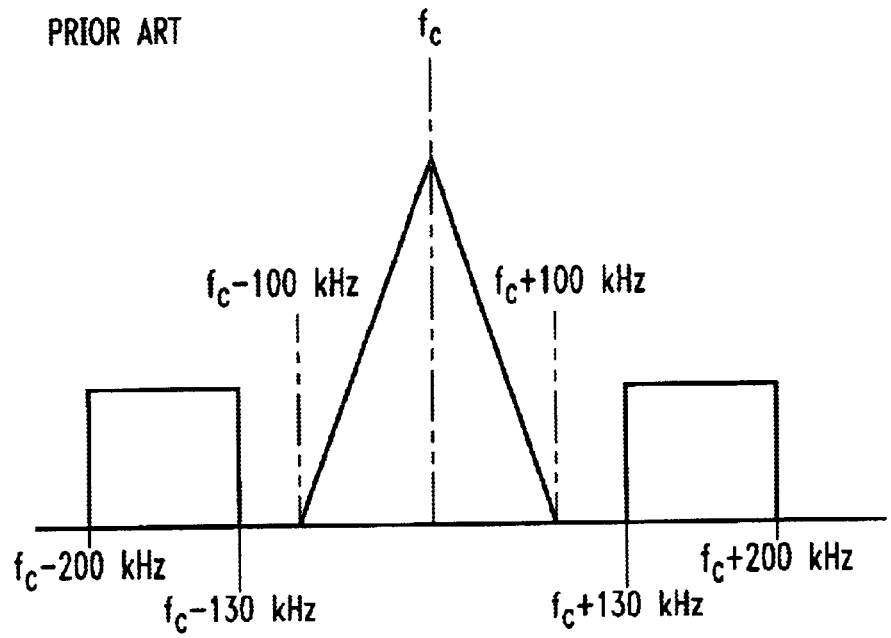
FIG. 1 shows the spectral allocation for an In Band On Channel Digital Audio Broadcasting signal.
Figure 2:
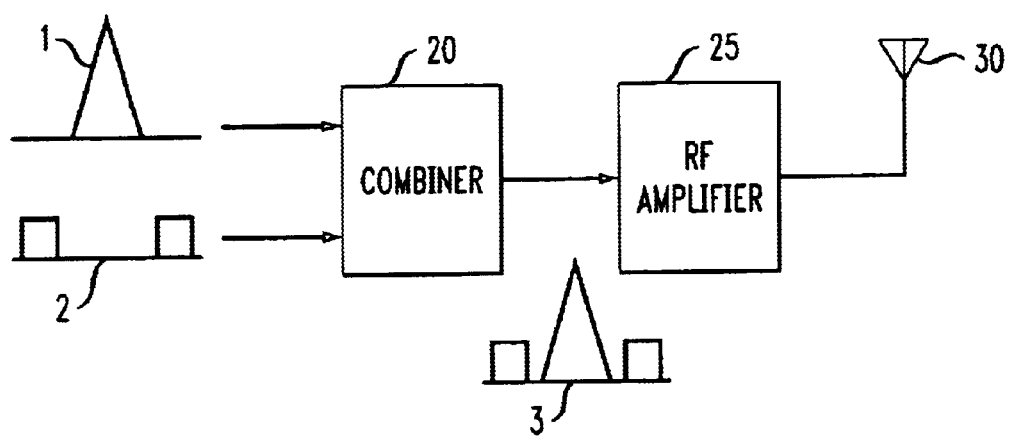
FIGS. 2 and 3 show prior art approaches to multiplexing disparate signals for transmission.
Figure 3:
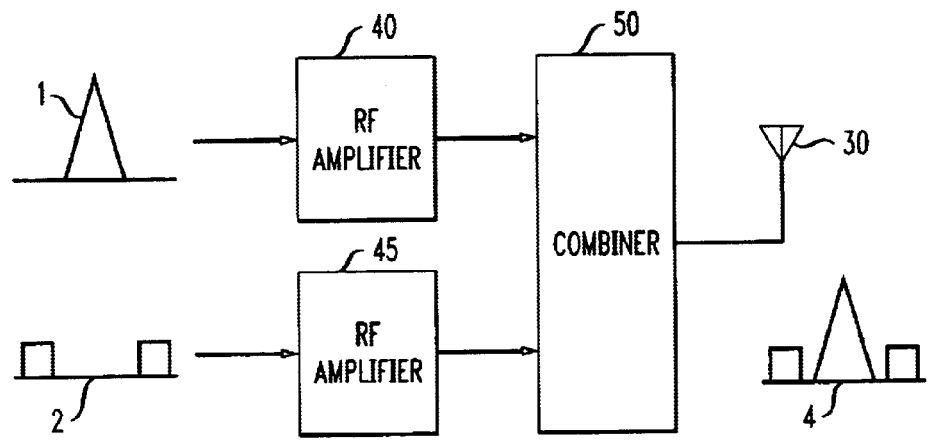
Figure 4:
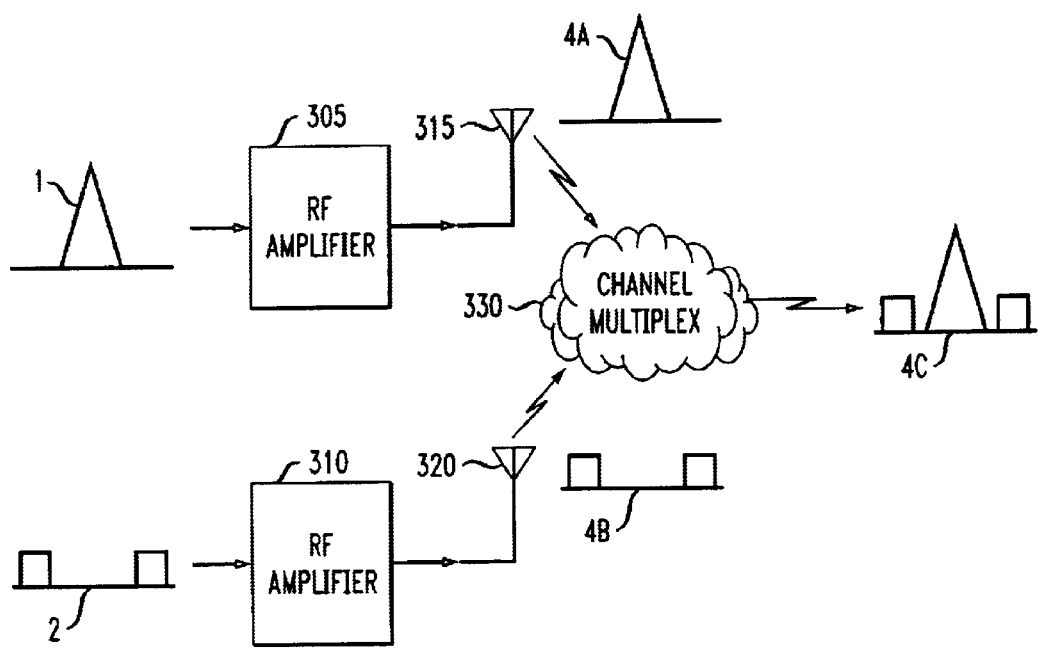
FIG. 4 shows an illustrative block diagram of a portion of a DAB FM transmitter in accordance with the principles of the invention.

An illustrative block diagram of a portion of a DAB FM transmitter in accordance with the principles of the invention is shown in FIG. 4. Other than the inventive concept, the elements shown in FIG. 4 are well known and will not be described in detail. Similarly, the remaining portions of the DAB system such as the corresponding FM receivers (not shown) and other parts of the FM transmitter (not shown) are well known and will not be described herein. (For example, see "Compatibility of FM hybrid in-band on-channel (IBOC) system for digital audio broadcasting," by B. W. Kroeger and P. J. Peyla; *IEEE Transactions on Broadcasting*, Vol. 43, No. 4, December 1997, pgs 421–430; also see references cited at "http:\\www.usadr.com.")

Transmitter 300 comprises non-linear RF amplifier 305, linear RF amplifier 310 and antennas 315 and 320. An analog FM signal ($f_c \pm 100$ kHz) is applied to non-linear RF amplifier 305 for amplification and transmission as signal 4A via antenna 315. As noted above, non-linear RF amplifier 305 is a class C amplifier. A digital FM signal ($f_c-200$ kHz, $f_c-130$ kHz; and $f_c+130$ kHz, $f_c+200$ kHz) is applied to linear RF amplifier 310 for amplification and transmission as signal 4B via antenna 320. Linear amplifier 310 is not required to be of very high power. In particular, the output signal of linear amplifier 310 must fit within the FCC mask in the sideband of the analog FM signal. This is approximately 20 dB below the analog FM signal. Since the disparate signals (the analog FM signal 4A and the digital FM signal 4B) are separated in frequency, the transmitted analog FM signal 4A and the transmitted digital FM signal 4B are combined, or multiplexed, together in the channel itself, i.e., channel multiplex 330, (here, the atmosphere) to form the transition DAB signal 4C. In other words, the transmitted analog FM signal 4A and the transmitted digital FM signal 4B are combined in a non-interfering fashion in the atmospheric channel to form via channel multiplex 330 transition transition DAB signal 4C. (As used herein the term "non-interfering" means that the signals do not significantly interfere, or significantly overlap, with each other in either the time or frequency domain.)

It should be noted that the above-described transmitter forms a frequency division multiplexed signal. Other forms of multiplexing can also be used. For example, time-division multiplexing can be performed by the addition of a controller for controlling the transmission times of the disparate signals.

As a result of the above, the inventive concept shows that one can multiplex a number of signals k, by using i transmitters where i>1. In the illustration above, k=i=2.

The foregoing merely illustrates the principles of the invention and it will thus be appreciated that those skilled in the art will be able to devise numerous alternative arrangements which, although not explicitly described herein, embody the principles of the invention and are within its spirit and scope. For example, the inventive concept is not limited to FM transmission.

What is claimed:

1. A method for transmitting a multiplexed signal over an atmospheric channel, the multiplexed signal comprising at least two signals, one signal being an analog signal and at least another signal being a digital signal, the method comprising the steps of:
    amplifying said analog signal by employing a non-linear amplifier;
    amplifying said digital signal by employing a linear amplifier;
    transmitting said non-linear amplified analog signal in said atmospheric channel by employing a first antenna; and
    transmitting said linear amplified digital signal in said atmospheric channel by employing a second antenna,
    wherein said non-linear amplified analog signal and said linear amplified digital signal are non-interfering in frequency such that combined transmission of the non-linear amplified analog modulated signal and the linear amplified digital modulated signal forms a multiplexed signal in the atmospheric channel.

2. The method of claim 1 wherein the transmitting steps result in a frequency division multiplexed signal in said atmospheric channel.

3. The method of claim 1 wherein the transmitting steps result in a time division multiplexed signal in said atmospheric channel.

4. The method of claim 1 wherein said analog signal is an analog FM signal and said digital signal is a digital FM signal.

5. A method for transmitting a multiplexed signal over an atmospheric channel, the multiplexed signal comprising at least k signals, at least one of said k signals being an analog signal and others of said k signals being digital signals, the method comprising the steps of:
    amplifying said at least one analog signal by employing a non-linear amplifier;
    amplifying said other digital signals by employing at least on linear amplifier; and
    transmitting the applied k signals in said atmospheric channel using i transmitters and a corresponding i antennas,
    wherein multiplexing of the amplified k signals occurs in the atmospheric channel, where i>1.

6. The method of claim 5 wherein the transmitting step results in a frequency division multiplexed signal in said atmospheric channel.

7. The method of claim 5 wherein the transmitting step results in a time division multiplexed signal in said atmospheric channel.

8. The method of claim 5 wherein said at least one signal is an analog FM signal and the said other signals are digital FM signals.

9. A transmitter comprising:
    a first transmitter for transmitting an analog modulated signal over an atmospheric channel, said first transmitter including a non-linear amplifier and a first antenna;
    a second transmitter for transmitting a digital modulated signal over the atmospheric channel, said second transmitter including a linear amplifier and a second antenna; and
    wherein the analog modulated signal and the digital modulated signal are non-interfering in frequency such that combined transmission of the non-linear amplified analog modulated signal and the linear amplified digital modulated signal forms a multiplexed signal in the atmospheric channel.

10. The transmitter of claim 9 wherein the analog modulated signal is an analog FM signal and the digital modulated signal is a digital FM signal.

* * * * *